United States Patent
Zhang et al.

(10) Patent No.: US 10,157,097 B2
(45) Date of Patent: Dec. 18, 2018

(54) REDUNDANT BYTES UTILIZATION IN ERROR CORRECTION CODE

(71) Applicant: SK Hynix Inc., Gyeonggi-do (KR)

(72) Inventors: Fan Zhang, Fremont, CA (US); June Lee, Sunnyvale, CA (US); Chenrong Xiong, San Jose, CA (US); Aman Bhatia, San Jose, CA (US); Naveen Kumar, San Jose, CA (US); David Pignatelli, Saratoga, CA (US)

(73) Assignee: SK Hynix Inc., Gyeonggi-do (KR)

( * ) Notice: Subject to any disclaimer, the term of this patent is extended or adjusted under 35 U.S.C. 154(b) by 57 days.

(21) Appl. No.: 15/487,239

(22) Filed: Apr. 13, 2017

(65) Prior Publication Data

US 2018/0046540 A1 Feb. 15, 2018

Related U.S. Application Data

(60) Provisional application No. 62/373,938, filed on Aug. 11, 2016.

(51) Int. Cl.
*G06F 11/10* (2006.01)
*H03M 13/09* (2006.01)
*H03M 13/11* (2006.01)

(52) U.S. Cl.
CPC ....... *G06F 11/1056* (2013.01); *H03M 13/098* (2013.01); *H03M 13/1111* (2013.01); *G06F 11/1076* (2013.01)

(58) Field of Classification Search
CPC ............ G06F 11/1056; G06F 11/1076; H03M 13/098; H03M 13/1111
See application file for complete search history.

(56) References Cited

U.S. PATENT DOCUMENTS

| | | | | |
|---|---|---|---|---|
| 5,602,786 A * | 2/1997 | Pascucci | .............. | G11C 29/789 365/185.09 |
| 5,671,178 A * | 9/1997 | Park | ...................... | G11C 29/82 365/185.09 |
| 5,894,441 A * | 4/1999 | Nakazawa | ........... | G11C 29/808 365/200 |
| 6,084,807 A * | 7/2000 | Choi | .................... | G11C 29/808 365/200 |
| 6,418,057 B1 * | 7/2002 | Hosogane | .............. | G11C 7/065 365/185.2 |
| 9,348,694 B1 | 5/2016 | Nassie | | |

(Continued)

*Primary Examiner* — Kyle Vallecillo
(74) *Attorney, Agent, or Firm* — Kilpatrick Townsend & Stockton LLP

(57) ABSTRACT

Techniques for codeword decoding are described. In an example, a system accesses information about a block of a storage device of the system. The block includes data lines and redundant lines. The data lines are available to store data and include a bad data line that is unreliable for data storage. The redundant lines include a redundant line that replaces the bad data line, and a free redundant line that remains available after replacement of all bad data lines from the data lines. The information includes an identifier of the bad data line and an identifier of the free redundant line. The system accesses a codeword stored in the block. A portion of the codeword is stored in the free redundant line. The system decodes the codeword based on the identifier of the bad data line and the identifier of the free redundant line.

20 Claims, 8 Drawing Sheets

(56) References Cited

U.S. PATENT DOCUMENTS

| | | | | |
|---|---|---|---|---|
| 2001/0017806 A1* | 8/2001 | Schamberger | ......... | G11C 29/72 |
| | | | | 365/202 |
| 2002/0122341 A1* | 9/2002 | Perner | ................ | G11C 29/4401 |
| | | | | 365/200 |
| 2003/0123301 A1* | 7/2003 | Jang | .................... | G11C 29/785 |
| | | | | 365/200 |
| 2007/0076504 A1* | 4/2007 | Suh | ....................... | G11C 11/406 |
| | | | | 365/222 |
| 2010/0083037 A1* | 4/2010 | Oberlaender | ......... | G11C 29/44 |
| | | | | 714/5.1 |
| 2014/0006849 A1* | 1/2014 | Ramirez | ............ | G06F 11/2053 |
| | | | | 714/6.13 |
| 2016/0034353 A1* | 2/2016 | Tuers | ................ | H03M 13/1111 |
| | | | | 714/764 |
| 2017/0090788 A1* | 3/2017 | Shlick | .................. | G06F 3/0619 |

\* cited by examiner

REDUNDANT BYTES UTILIZATION IN ERROR CORRECTION CODE

CROSS-REFERENCES TO RELATED APPLICATIONS

The present application claims priority to U.S. Provisional Application No. 62/373,938, entitled "REDUNDANT BYTES UTILIZATION IN ECC FOR NAND FLASH STORAGE," filed Aug. 11, 2016, which is commonly assigned and expressly incorporated by reference herein in its entirety for all purposes.

BACKGROUND

In storage devices, such as a NAND flash storage, data is written on a page level in blocks. In an example, each page has sixteen kilobytes (KB) data along with spare bytes. After chip production, some bitlines (also called bad columns) may be faulty in a block. Redundant bytes are provided to replace and fix the bad columns. Continuing with the previous example, there may be twenty-four redundant bytes per two KB of data. If there are more than twenty-four bytes bad columns in a block, the block is marked as a bad block. If there are less than twenty-four bytes bad columns, some of the redundant byte are used for fixing the bad columns. Generally in this case, however, some redundant bytes remain available.

BRIEF SUMMARY

Techniques for codeword encoding and decoding are described. In an example, a system uses redundant bytes to improve the bit error rate (BER) performance associated with decoding. For instance, the system includes a storage device that has an array of data lines and redundant lines. Some of the data lines include defective memory cells. These data lines are referred to as bad data lines. A portion of the redundant lines are used to replace the bad data lines. The remaining portion of the redundant lines would not be otherwise used and is available. This remaining portion is referred to as free redundant lines. To improve the BER performance, the system writes and stores a portion of a codeword to a free redundant line, thereby extending the length of the codeword. Because of the additional length, processing the codeword (e.g., writing, storing, reading, decoding) is more resilient to noise.

In one example, the codeword is lengthened to use all of the data lines and redundant lines. In this example, in addition to using a free redundant line, a portion of the codeword is written to the bad data lines. However, the storage locations of this portion are declared as unreliable (e.g., their log-likelihood ratios set to zero for low density parity check decoding). The codeword is decoded by processing this portion and the remaining portions of the codeword.

In another example, the codeword is lengthened to use the free redundant lines and avoid any bad data line. In this example, a portion of the codeword is written to a free redundant line. No portion of the codeword is written to the bad data lines. The codeword is read from storage. The read skips the bad data lines. A properly sized parity check matrix, such as one having a number of columns equal to or greater than the length of the codeword, is selected from a plurality of parity check matrices available on the system. The codeword is decoded based on the selected parity check matrix.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
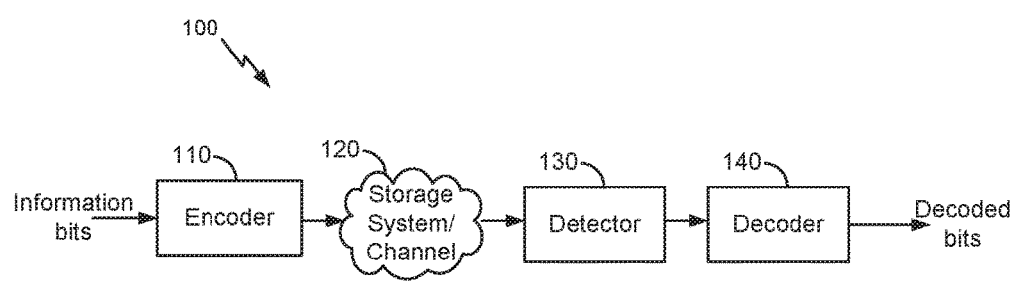
FIG. 1 illustrates an example high level block diagram of an error correcting system, in accordance with certain embodiments of the present disclosure.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications, and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Embodiments of the present disclosure involve improving an overall performance of a system that implements block storage with redundant bytes. Relative to existing systems, the bit error rate (BER) performance of a decoder is improved by lengthening codewords (e.g., error correction codes). More specifically, any remaining redundant bytes that have not been used to fix defective cells in a block (e.g., a bad column) are used for encoding the codewords. In the interest of clarity of explanation, these unused redundant bytes are referred to herein as "free redundant bytes." In an example, additional parity bits for a codeword are written to one or more free redundant bytes, thereby lengthening the codeword. The codeword is decoded based on these additional parity bits. Because the codeword has now a greater number of parity bits, the BER performance of the decoder is relatively improved with minimal hardware changes.

Various embodiments are possible for using the free redundant bytes to improve the BER performance. In one example embodiment, both bytes corresponding to the defective cells and the free redundant bytes are used for storing codewords. For instance, a codeword is written to the entire block, including to the defective cells. In this way, the data bytes and redundant bytes are fully used. The codeword is then decoded from the data bytes and the redundant bytes. The bad column information (e.g. location of the defective cells) is known and used in the decoding. Data written to a faulty cell is declared to be unreliable. The decoder uses these declarations when decoding the codewords. This embodiment is simple and easy to implement, involves minimal overheard, and allows using redundant byes in code construction and decoding.

To illustrate, a low density parity check (LDPC) decoder uses log-likelihood ratio (LLR) obtained from multiple reads. The LLRs are fed to the decoder. A bit LLR value describes how much reliable a bit is observed from channel. As bad columns bits is noisy, these bits can be erased (set LLR to zero) in the decoder.

In another example embodiment, the length of a codeword is varied depending on the number of available free redundant bytes. Unlike the above embodiment, here, data is not written to the defective cells given the bad column information. A portion of the redundant bytes is used for the replacement of the defective cells. For instance, this portion stores bits of a codeword (e.g., data bits or parity bits). The remaining portion of redundant bytes (i.e., the free redundant bytes) would otherwise be available. However, in this embodiment, this free portion is used to store additional bits of a codeword (e.g., additional parity bits). Because the bad column information is known, reading and/or decoding data from the defective cells would be skipped. Instead, the codewords is decoded from the remaining bytes of the block, including from the free redundant bytes. The decoder can determine the length of the codeword based on the bad column information because no portion of the codeword is stored in the defective cells. A properly sized parity check matrix is selected based on the length of the codeword and used for the decoding.

In an illustrative example, because the length of the codeword can vary depending on the number of available free redundant bytes, the resulting code rate is also variable. A code construction can be implemented, where this construction changes the rate of the code with minimal hardware changes. More specifically, a single LDPC code with different incremental parities can be used. Nested parity check matrices are available for the decoding, where the nesting reflects the incremental parities. The hardware is simpler than having different code rates for LDPC codes.

FIG. 1 illustrates an example high level block diagram of an error correcting system 100, in accordance with certain embodiments of the present disclosure. In the example shown, the system 100 includes an encoder 110, a storage system 120, a detector 130, and a decoder 140. The encoder 110 receives information bits that include data which is desired to be stored in the storage system 120 or transmitted in a communications channel. Encoded data is output by the encoder 110 and is written to the storage system 120. In various embodiments, the storage system 120 may include a variety of storage types or media, such as magnetic disk drive storage, flash storage (e.g., NAND flash storage), etc. In some embodiments, the techniques described herein are employed in a transceiver and instead of being written to or read from storage, the data is transmitted and received over a channel (e.g., wired or wireless). In this case, the errors in the received codeword may be introduced during transmission of the codeword.

When the stored data is requested or otherwise desired (e.g., by an application or a user), the detector 130 receives the data from the storage system 120. The received data may include some noise or errors. The detector 130 performs detection on the received data and outputs decision and/or reliability information corresponding to one or more bits in a codeword. For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure the detector is in that decision (e.g., a large magnitude indicates a high reliability or certainty).

The decision and/or reliability information is passed to the decoder 140 which performs decoding using the decision and/or reliability information. A soft input decoder utilizes both the decision and the reliability information to decode the codeword. A hard decoder utilizes only the decision values in the decoder to decode the codeword. After decoding, the decoded bits generated by the decoder 140 are passed to the appropriate entity (e.g., the user or application which requested it). With proper encoding and decoding, the information bits match the decoded bits.

The decoder 140 may implement a number of decoding schemes (e.g., decoding algorithms implemented using application-specific integrated circuit (ASIC), a field-programmable gate array (FPGA), and/or a general purpose processor (e.g., an Advanced RISC Machine (ARM) core) depending on the type of the codeword and whether or not reliability information corresponding to each bit is available. An example decoding scheme includes low density parity check (LDPC) decoding. Nonetheless, embodiments of the present inventions are not limited to this example decoding scheme and similarly to other ones including, for example, turbo code decoding.

In an illustrative example of LDPC decoding, the decoder 140 is an LDPC decoder. The decision and/or reliability information is passed to the LDPC decoder which performs LDPC decoding using the decision and reliability information. A soft input decoder utilizes both the decision and the reliability information to decode the codeword. A hard decoder utilizes only the decision values in the decoder to decode the codeword. Generally, the decoding relies in a parity check matrix, which is optimized for the LDPC decoder by design. With proper encoding and decoding, the information bits match the decoded bits.

Generally, LDPC codes are linear block codes defined by a sparse parity check matrix H, which consists of zeros and ones. The term "sparse matrix" is used herein to refer to a matrix in which a number of non-zero values in each column and each row is much less than its dimension. The term "column weight" is used herein to refer to number of non-zero values in a specific column of the matrix. The term "row weight" is used herein to refer to number of non-zero values in a specific row of the matrix. If column weights of all of the columns in a parity check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

LDPC codes are usually represented by bipartite graphs. One set of nodes, the variable or bit nodes correspond to elements of the code word and the other set of nodes, e.g., check nodes, correspond to the set of parity check constraints satisfied by the code words. Typically the edge connections are chosen at random. The error correction capability of an LDPC code is improved if cycles of short length are avoided in the graph. In a (r,c) regular code, each of the n variable nodes (V1, V2, . . . , Vn) has connections to r check nodes and each of the m check nodes (C1, C2, . . . , Cm) has connections to c bit nodes. In an irregular LDPC code, the check node degree is not uniform. Similarly the variable node degree is not uniform. In Quasi-cyclic ("QC") LDPC codes, the parity check matrix H is structured into blocks of p×p matrices such that a bit in a block participates in only one check equation in the block, and each check equation in the block involves only one bit from the block. In QC-LDPC codes, a cyclic shift of a code word by p results in another code word. Here p is the size of square matrix which is either a zero matrix or a circulant matrix. This is a generalization of a cyclic code in which a cyclic shift of a code word by 1 results in another code word. The block of p×p matrix can be a zero matrix or cyclically shifted identity matrix of size p×p.

From an LDPC parity check matrix, a LDPC generator matrix can be generated. A generator matrix is used to generate LDPC encoded data from the input data. For example, if the input data is represented as u, a 1×(n−m) matrix, and the encoded write data is represented as c (a 1×n matrix) then c=u*G, where "*" is a matrix multiplication. In some cases, a generator matrix (G) is manipulated to be in a special form (i.e., a systematic matrix) where G=[I P] and I is the identity matrix and P is a parity generator matrix. In systematic form, the encoded data (c) includes the input data (u) in its original form. In one example, the encoded data may be the input data (u) followed by the parity bits. Parity data (p) may be obtained from u*P and when combined (e.g., by appending or concatenating) with the input data generates the codeword (i.e., the encoded data).

Figures 2A, 2B:
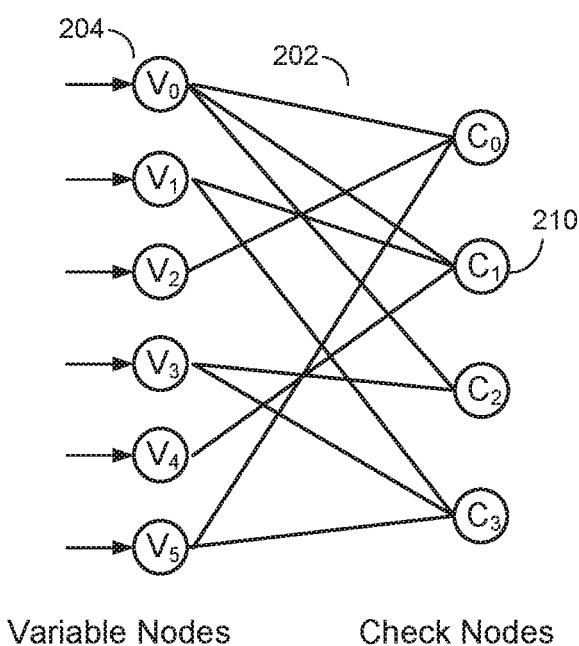
FIGS. 2A-2B illustrate an example parity check matrix and an example graph representing the parity check matrix, in accordance with certain embodiments of the present disclosure.

FIG. 2A illustrates an example parity check matrix H 200 and FIG. 2B illustrates an example bipartite graph corresponding to the parity check matrix 200. In this example, the parity check matrix 200 has six column vectors and four row vectors. Network 202 shows the network corresponding to the parity check matrix 200 and represent a bipartite graph. Various types of bipartite graphs are possible including, for example, a Tanner graph.

Generally, the variable nodes in the network 202 correspond to the column vectors in the parity check matrix 200. The check nodes in the network 202 correspond to the row vectors of the parity check matrix 200. The interconnections between the nodes are determined by the values of the parity check matrix 200. Specifically, a "1" indicates the corresponding check node and variable nodes have a connection. A "0" indicates there is no connection. For example, the "1" in the leftmost column vector and the second row vector from the top in the parity check matrix 200 corresponds to the connection between the variable node 204 and the check node 210.

A message passing algorithm is generally used to decode LDPC codes. Several variations of the message passing algorithm exist in the art, such as min-sum algorithm, scaled min-sum algorithm or the like. In general, any of the variations of the message passing algorithm may be used in an LDPC decoder without departing from the teachings of the present disclosure. Message passing uses a network of variable nodes and check nodes, as shown in FIG. 2B. The connections between variable nodes and check nodes are described by and correspond to the values of the parity check matrix 200, as shown in FIG. 2A.

A hard decision message passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. The response message corresponds to a value that the check node believes that the variable node should have based on the information received from the other variable nodes connected to that check node. This response is calculated using the parity check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found or a maximum number of iterations are performed without finding a correct codeword. It should be noted that a soft-decision decoder works similarly, however, each of the messages that are passed among check nodes and variable nodes, also include reliability of each bit.

An example message passing algorithm may be performed. In this example, L(qij) represents a message that is sent by variable node $v_i$ to check node $c_j$; L($r_{ji}$) represents the message sent by check node $c_j$ to variable node $v_i$; and (L($c_i$)) represents initial LLR value for each variable node $v_i$. Variable node processing for each L(qij) can be done through the following steps:

(1) Read L($c_i$) and L($r_{ji}$) from memory.
(2) Calculate L(Qi-sum)=L($c_i$)+Scaling Factor*$\Sigma_{j \in c_i}$L($r_{ij}$).
(3) Calculate each L(Qi-sum)−L($r_{ij}$)
(4) Output L(Qi-sum) and write back to memory.
(5) If this is not the last column of the memory, go to Step 1 and increment i by one.
(6) Compute parity check-sums, if they are all equal to zero or the number of iterations equals a maximum limit, stop; otherwise, perform check node processing.

Check node processing for each L(rji) can be performed as follows:

(1) Read one row of qij from memory.
(2) Calculate L(Rj-sum) as follows:

$$L(Rj - \text{sum}) = (\Pi_{i' \in R_j} \alpha_{i'j}) \varnothing (\Sigma_{i' \in R_j} \varnothing(\beta_{i'j}))$$

$$\alpha_{ij} = \text{sign}(L(q_{ij})), \beta_{ij} = |L(q_{ij})|,$$

$$\varnothing(x) = -\log\left(\tanh\left(\frac{x}{2}\right)\right) = \log\left(\frac{e^x + 1}{e^x - 1}\right)$$

(3) Calculate the individual $L(r_{ji}) = (\Pi_{i' \in R_{ji}} \alpha_{i'j}) \varnothing (\Sigma_{i' \in R_{ji}} \varnothing (\beta_{i'j}))$ for check nodes.
(4) Write back $L(r_{ji})$ to memory.
(5) If this is not the last row of memory, then go to the first step and increment j by one.

Figure 3:
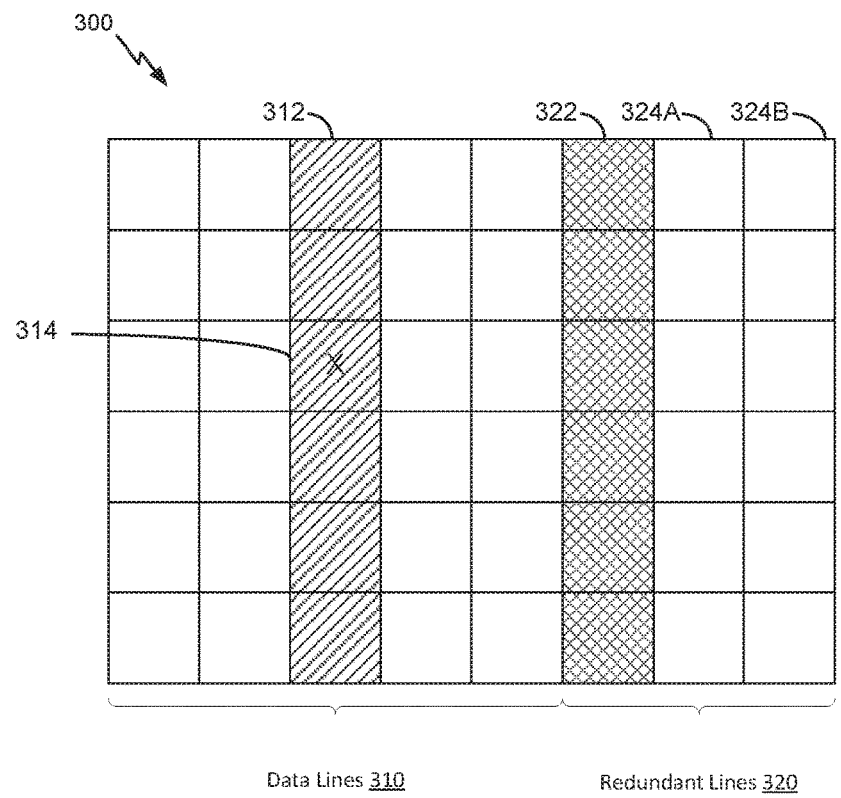
FIG. 3 illustrates an example block storage, in accordance with certain embodiments of the present disclosure.

FIG. 3 illustrates an example block storage, in accordance with certain embodiments of the present disclosure. The block storage can be used in flash storage and other storage types. Generally, a flash storage device is a type of electrically erasable programmable read-only memory (EEPROM) that can be erased and reprogrammed in blocks instead of one byte at a time. The flash storage is made of a large number (in the millions or more) of memory gates (e.g., NAND memory gates) on a die (e.g., a silicon die). The die contains one or more planes (usually one or two). Each plane contains a number of blocks, which are the smallest unit that can be erased. In turn, each block contains a number of pages which are the smallest unit that can be programmed (e.g., written to). For instance, the block can be one-hundred twenty-eight KB to eight megabytes (MB) in size, while a page is four to sixteen KB. The exact size depends on the flash manufacturer and specific storage device. Nonetheless, program operations (e.g., writes) take place at a page level, while erase operations take place at a block level.

As illustrated in FIG. 3, the die of the storage device includes a memory array 300 of a large number of memory cells arranged in row and column fashion. Each of the memory cells includes a floating gate field-effect transistor capable of holding a charge. The cells are grouped into the pages and blocks. Each of the cells within a block can be electrically programmed in a random basis by charging the floating gate. The charge can be removed from the floating gate by a block erase operation. The data in a cell is determined by the presence or absence of the charge in the floating gate.

The type of the data storage in the cells describes the main forms of flash, namely SLC, MLC, TLC, and QLC. SLC stands for single-level cell in which each memory cell records only a single value (of two states)—on or off, 0 or 1, based on the voltage of the cell. MLC, or multi-level cell, is capable of storing up to four states representing two bits of data—00, 01, 10, or 11. TLC—triple-level cell—stores three bits in a single cell, using the eight states from 000 to 111. TLC—quad-level cell—stores four bits in a single cell, using the sixteen states from 0000 to 1111.

A column of the memory array 300 includes a set of the cells corresponding to cell-transistors connected along sources/drains and following a particular column location in a block. A common terminology for referring to the column is "bit-line" (although multiple bits—or a symbol—can be stored in each cell). A row of the memory array 300 includes a set of the cells corresponding to cell-transistors connected along the gates and following a particular row location in a block. A common terminology for referring to the row is "word-line." The intersection of a column and a row is a cell that stores data (e.g., single or multiple bits depending on the storage type—SLC, MLC, TLC, and QLC.)

Many flash storage devices have built-in redundancy. Specifically, certain cells may be defective (e.g., faulty or corrupted) for various manufacturing reasons. For each block, there can be a number of redundant columns and/or redundant rows. Various techniques are available to replace defective cells, which can be referred to as bad cells. In an example, if a cell is defective, the column containing the cell, which can be referred to as a bad column, is replaced with one of the redundant columns. In another example, if a cell is defective, the row containing the cell, which can be referred to as a bad row, is replaced with one of the redundant rows. In yet another example, if a cell is defective, the cell (instead of the corresponding column and/or row) is replaced with a cell from a redundant column or a redundant row. Generally, the locations of the bad cells, bad columns, and/or bad rows are determined as part of the manufacturing process. Information about these locations, such as identifiers of the bad cells, bad columns, and/or bad row and/or corresponding address locations within a block, becomes known and is available for managing how data is written to and read from the flash storage device. Replacing a bad column with a redundant column (and, similarly, row and cell replacement) does not mean that the bad column is physically replaced on the die with the redundant column. Instead, the information about the two columns (e.g., their identifiers or address locations) is used for managing the write and read operations. For instance, data is written to and read from the redundant column instead of the bad column. This management can be logical (e.g., by using address information) and/or the bad column can be disabled (e.g., electrically or logically disconnected) and the redundant column enabled instead (e.g., electrically or logically connected).

In the interest of clarity of explanation, FIG. 3 illustrates the use of redundant columns (e.g., redundant bit-lines). However, the embodiments of the present disclosure are not limited as such and similarly apply to the use of redundant rows (e.g., redundant word-lines) and/or redundant cells (e.g., specific cells from a redundant column or a redundant row). Generally, a data line refers to a bit-line or a word-line available from a block to store data (e.g., bits or symbols), where this line is not a redundant bit-line or a redundant word-line. A bad data line refers to a data line that includes at least one bad cell. In comparison, a redundant line refers to a redundant bit-line or a redundant word-line from the block to replace a bad data line. A redundant cell refers to a cell from a redundant line. These and other terminologies are illustrated in FIG. 3.

More specifically, the memory array 300 contains data lines 310 (shown as bit-lines) and redundant lines 320 (shown as redundant bit-lines). The data lines 310 are available to store data and include at least one bad data line 312 (shown as a column with a diagonal shade). The bad data line 312 is unreliable for data storage because it contains at least one defective cell 314 (shown with an "X" mark).

One of the redundant lines 320, shown as the redundant line 322, is used to replace the bad data line 312. For example, data is written to the redundant line 322 instead of the bad data line 312. A number of the redundant lines 320 replaces an equivalent number of bad data lines. Because the redundant line 322 is used for the replacement, this line is referred to herein as a "replacement redundant line." Once the replacement is complete, some of the redundant lines 320 remain available because they do not replace any bad data line. This can be the case when the total number of the redundant lines 320 is larger than the total number of bad data lines. In this case, a remaining redundant line is referred to as a "free redundant line." In other words, a free redundant line remains available after replacement of all bad data lines from the data lines 310.

For illustrative purposes, FIG. 3 shows a total of five data lines 310 and three redundant lines 320. The data lines 310 contain one bad data line 312. The replacement redundant line 322 replaces the bad data line 312 and, thus, no longer remains available. Out of the three redundant lines 320, two remain available after replacing the bad data line 312. These two lines are shown as free redundant lines 324A and 324B.

Of course the above total numbers are provided herein for illustrative purposes. Different total numbers can exist depending on the defect of the memory array 300. Generally, the total number of data lines is "N," the total number of redundant lines is "R," and the total number of bad data lines is "B," where each of "N" and "R" is an integer equal to or greater than one, and where "B" is an integer equal to or greater than zero. "B" is generally smaller than or equal to "N." Free redundant lines exist when "R" is greater than "B." In this case, the total number of free redundant lines is "R−B" and the total number of replacement redundant lines is "B." Information about the locations of the "B" bad columns, replacement redundant lines, and free redundant lines is known and includes, for instance, their locations. "$(x_1, x_2, \ldots, x_b)$" is used herein to denote the bad column locations.

Figure 4:
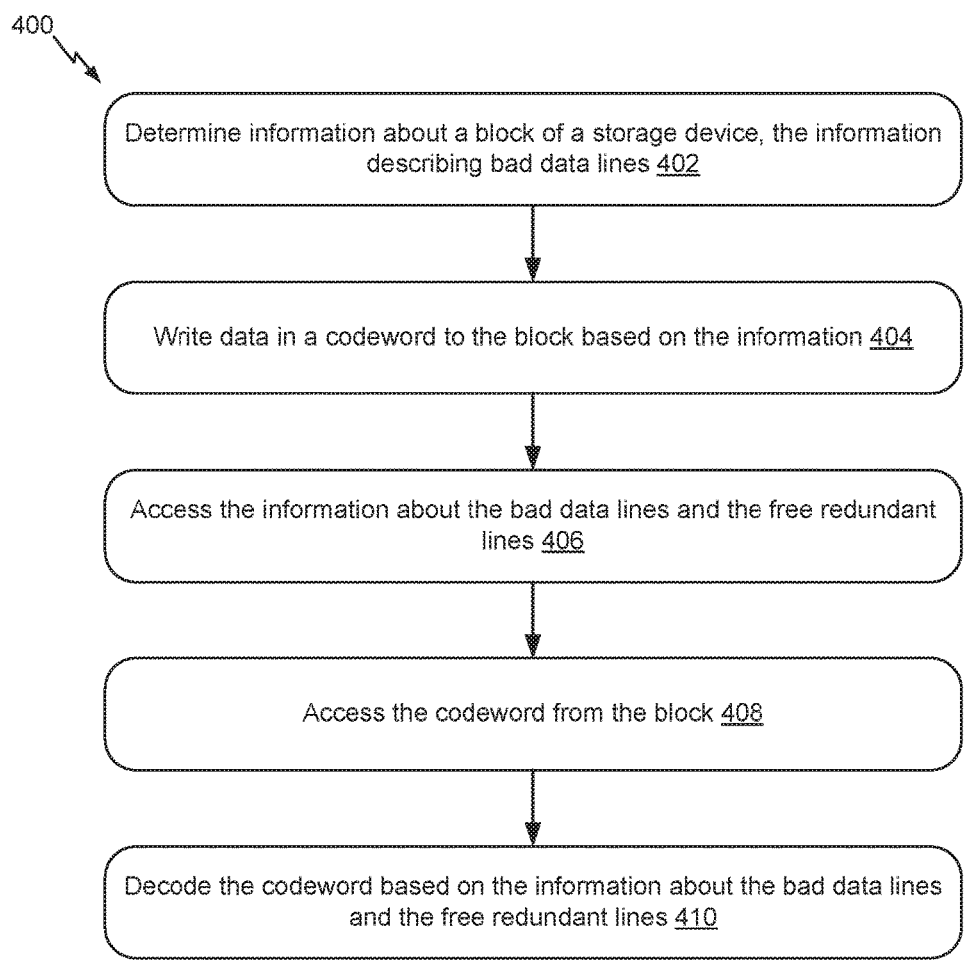
FIG. 4 illustrates an example flow for using free redundant bytes to improve performance of error correction code, in accordance with certain embodiments of the present disclosure.
Figure 5:
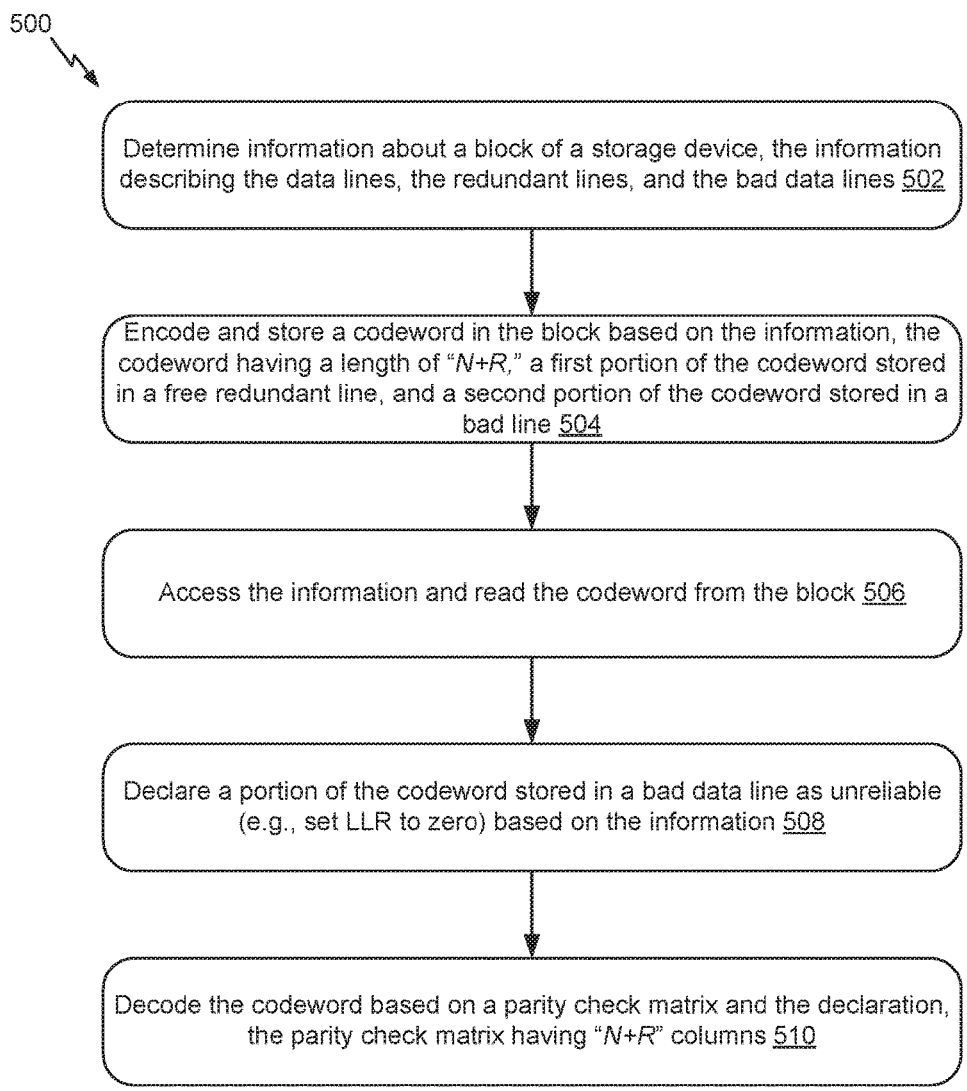
FIG. 5 illustrates an example flow for using all data and redundant bytes to improve performance of error correction code, in accordance with certain embodiments of the present disclosure.
Figure 6:
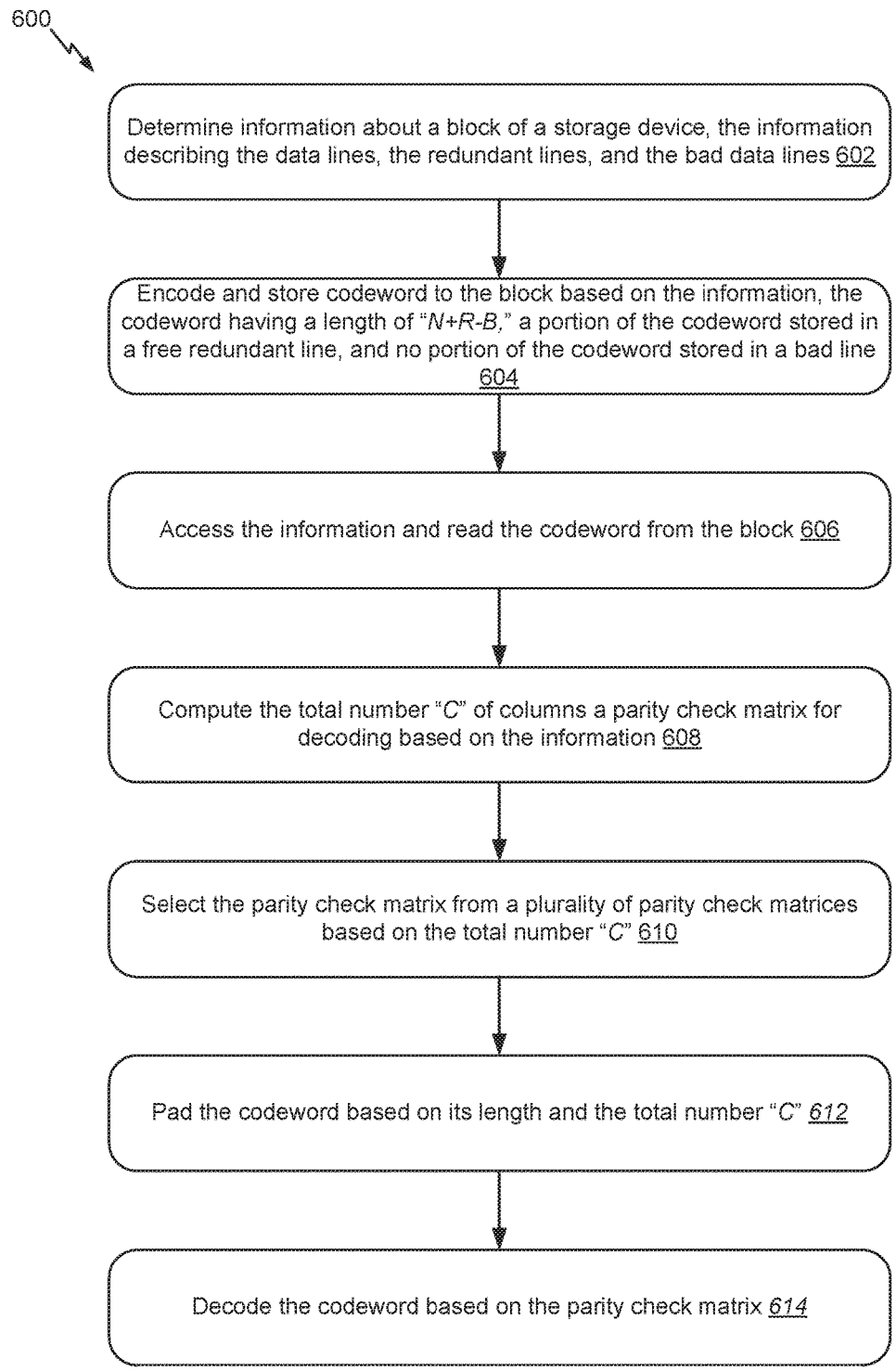
FIG. 6 illustrates an example flow for selectively using redundant bytes to improve performance of error correction code, in accordance with certain embodiments of the present disclosure.

Turning to FIGS. 4-6, the figures illustrate example flows for processing a codeword. A system, such as an encoding system and/or decoding system that implement flash storage (e.g., the system 100 of FIG. 1), may be configured to perform the illustrative flows. Instructions for performing the operations of the illustrative flows can be stored as computer-readable instructions on a non-transitory computer-readable medium of the system. As stored, the instructions represent programmable modules that include code or data executable by a processor of the system. The execution of such instructions configures the system to perform the specific operations shown in the figures and described herein. While the operations are illustrated in a particular order, it should be understood that no particular order is necessary and that one or more operations may be omitted, skipped, and/or reordered.

FIG. 4 illustrates an example flow 400 for using free redundant bytes to improve performance of error correction code, in accordance with certain embodiments of the present disclosure. Data is written to and read from a storage device, such as a flash storage device, that is configured to store the data in blocks. Redundancy can be provided given a set of redundant columns or redundant rows (generally referred to in the example flow 400 as redundant lines) and/or given a set of redundant cells from the redundant lines.

The example flow 400 starts at operation 402, where the system determines information about a block of the storage device. The information describes bad data lines and free redundant lines of the block. For example, the information includes identifiers of bad data lines and identifiers of redundant lines. An identifier can include a description of a line (e.g., a corresponding bad data line or free redundant line), such as its storage location (e.g., an address). This information can be derived through the manufacturing process of the storage device (e.g., in a quality test phase) and can be stored in the memory of the system (e.g., in the storage device itself or in some other memory). The system accesses the information from the memory.

At operation 404, the system writes data to the block based on the information. For example, the system (e.g., an encoder thereof) generates a codeword that encodes the data. In addition to data bits, the codeword can include parity bits for error correction. The system (e.g., the encoder) lengthens the codeword by including additional parity bits in the free redundant bytes. To illustrate, and referring to FIG. 3, existing systems typically generate a codeword of length "N" (wherein "N" is the total number of data lines). In embodiments herein, the system increases this length from "N" to potentially "N+R" (where, "R" is the total number of redundant lines). Some of the free redundant lines store the additional parity bits.

Various embodiments to lengthen the codeword during the encoding (and the related decoding) are possible and are further described in the next figures. Briefly, in one embodiment, the codeword has a length of "N+R," where a portion of the codeword (e.g., data and/or parity bits) is written to bad data lines. This embodiment is further illustrated in FIG. 5. In another embodiment, the codeword has a length of "N+R−B" (where, "B" is the total number of bad data lines), where no portion of the codeword is written to the bad data lines. Instead, the bad data lines are avoided or skipped. A set of the redundant lines is used to store the original codeword (e.g. the data bits and/or the parity bits of the codeword having the length "N"). The remaining set of the redundant lines is used to lengthen the codeword (e.g., "R−B" additional parity bits are stored in this set). This embodiment is further illustrated in FIG. 6.

At operation 406, the system accesses the information about the bad and the redundant lines from the memory. While operations 402 and 404 correspond to writing data to the storage device, operation 406 and the subsequent ones correspond to reading the written data from the storage device. In an example, the system (e.g., a decoder thereof) accesses the information from the memory and uses the information to determine the length of the codeword and/or the locations of the bad data lines and free redundant lines. The length and location information are subsequently used in the decoding.

At operation 408, the system accesses the codeword from the block. For example, the system uses the size and location information to read the codeword from the block (e.g., its data bits and parity bits as stored in the block). The read can depend on the embodiment used to encode the codeword. For example, if the codeword has a length "N+R," all the lines (including bad data lines and free redundant lines) are read. On the other hand, if the codeword has a length of "N+R−B," the read can skip the "B" bad data lines. Instead, only the "N+R−B" may be read.

At operation 410, the system decodes the codeword based on the information about the bad data lines and the free redundant lines. For example, the system uses the different total numbers to determine the length of the codeword and storage location storing its data bits and parity bits. The decoding relies on the data bits and parity bits read from the block. To illustrate, in LDPC decoding, a proper sized parity check matrix is used to decode the codeword given the read data and parity bits.

Similarly to operation 408, the decoding of operation 410 depends on the embodiment used to encode the codeword. For example, if the codeword has a length "N+R" and all the lines are read, a portion of the code word (e.g., a subset of the data bits) would have been stored in a bad data line. In this case, the decoding involves declaring the portion stored in the bad data line as unreliable for the decoding based on the identifier of the bad data line. To illustrate, in LDPC decoding, the LLR of this portion can be set to zero. In another example, if the codeword has a length of "N+R−B" and the bad data lines are skipped, the decoder decodes the codeword given the data bits and parity bits read from the remaining lines. To illustrate, in LDPC decoding, the decoder selects a proper parity check matrix based on the length of the codeword. In this case, the selected parity check matrix has a total number of columns "C," where "C" is greater than or equal to the length of the codeword (e.g., "N+R−B").

FIG. 5 illustrates an example flow 500 for using all data and redundant bytes to improve performance of error correction code, in accordance with certain embodiments of the present disclosure. The operations of this flow 500 can be implemented as sub-operations of flow 400 of FIG. 4. Referring back to the memory array 300 of FIG. 3, in the example flow 500, the codeword has a length of "N+R." At least a portion of the codeword (e.g., "B" data bits, "B" parity bits, or a combination of "B" data and parity bits) is written to the "B" data lines.

The example flow 500 starts at operation 502, where the system determines information about a block of a storage device. The information at least describes the data lines, the redundant lines, and the bad data lines. For example, the information includes their total numbers "N," "R," and "B." The information also at least identifies the locations of the bad data lines and the replacement data lines. For instance, the information includes identifiers of the storage locations of the bad data lines and replacement data lines. This information is available from the memory of the system.

At operation 504, the system encodes and stores a codeword in the block based on the information. For example, the system (e.g., the encoder thereof) generates the codeword to have a length of "N+R." In addition to data bits, the codeword contains parity bits for error correction. For instance, the codeword is an LDPC codeword.

In an example, there are "K" data bits and "N+R−K" parity bits, where "K" is an integer greater than or equal to one. The "N" data lines contain "B" bad data lines. The "R" redundant lines contain "B" replacement redundant lines (the ones used to replace the "B" bad column lines) and "R−B" free redundant lines. A subset of the data bits and/or parity bits is written to and stored at the "N−R" free redundant lines. This subset represents a first portion of the codeword. Another subset of the data bits and/or parity bits is written to and stored at the "B" bad data lines. This subset represents a second portion of the codeword. In an example, the second portion is written to the "B" replacement redundant lines, such that the data bits and/or parity bits contained therein are redundantly written to both the bad data lines and the replacement redundant lines. In another example, the specific redundancy need not be observed. Instead, the portion of the codeword written to the "B" bad data lines is different from the portion of codeword written to the "B" replacement redundant lines. The remaining portions of the codeword, whether data bits and/or parity bits, are written to and stored at the "N−B" data lines (e.g., the data lines excluding the bad data lines).

Accordingly, in one particular example of an LDPC codeword, a data bit (or data symbol) of this codeword is stored redundantly in both a bad data line and a replacement redundant line. A parity bit (or parity symbol) is stored in a free redundant line. In another particular example of an LDPC decoder, a data bit (or data symbol) is stored in a bad data line, a parity bit (or parity symbol) is stored in a replacement redundant line, and another parity bit (or parity symbol) is stored in a free redundant line. Of course, other variations are possible, wherein any variation of a data bit (or data symbol) and parity bit (or parity symbol) or any combination of data bit and parity bit (e.g., in MLC, TLC, and QLC storage types) is stored in a cell that belongs to a data line (including a bad data line), a replacement redundant line, or a free redundant line.

At operation 506, the system accesses the information and reads the codeword from the block. This operation corresponds to a start of the decoding. For example, the information is accessed from the memory. The system determines the different total numbers and storage locations of the data lines and redundant lines from the information. Given that the length of the codeword is known and does not vary (e.g., set to "N−R"), the system need not, but may derive this length from the determined numbers "N" and "R." The data and parity bits of the codeword are read from the storage locations.

At operation 508, the system declares a portion of the codeword stored in a bad data line as unreliable. The declaration is repeated across the various bad data lines. In an example, the bad data line locations "$(x_1, x_2, \ldots, x_b)$" are known to the system from the information. Bits (or symbols), whether data bits or parity bits, at these locations are flagged as unreliable. The system (e.g., the decoder thereof) erases the LLR information at "$(x_1, x_2, \ldots, x_b)$" and initializes the LLRs to zero. An LDPC decoder can exploit this erasure information to provide better BER performance.

At operation 510, the system decodes the codeword based on a parity check matrix and the declaration. In an example, the parity check matrix has a total number "C" of columns, where "C" is equal to "N+R" (e.g., the length of the codeword). Soft decoding can be implemented by using LLR information, including the LLR information about the unreliable bits (or symbols).

FIG. 6 illustrates an example flow for selectively using redundant bytes to improve performance of error correction code, in accordance with certain embodiments of the present disclosure. The operations of this flow 600 can be implemented as sub-operations of flow 400 of FIG. 4. Referring back to the memory array 300 of FIG. 3, in the example flow 600, the codeword has a length that falls in the range of "N" to "N+R." The specific length depends on the actual number "B" of bad data lines and, conversely, the total number "R−B" of available free redundant lines. Generally, no portion of the codeword is written to a bad data line. Instead, the various portions of the codeword are written to the data lines (except the bad data lines), the replacement redundant lines, and the free redundant lines.

The example flow 600 starts at operation 602, where the system determines information about a block of a storage device. The information at least describes the data lines, the redundant lines, and the bad data lines of the block. This operation is similar to operation 502 of the example flow 500.

At operation 604, the system encodes and stores a codeword in the block based on the information. For example, the system (e.g., the encoder thereof) generates the codeword to have a length of "N+R−B." In addition to data bits, the codeword contains parity bits for error correction. For instance, the codeword is an LDPC codeword.

In an example, there are "K" data bits and "N+R−B−K" parity bits, where "K" is an integer greater than or equal to one. A subset of the data bits and/or parity bits is written to and stored at the "N−R" free redundant lines. This subset represents a first portion of the codeword. Another subset of the data bits and/or parity bits is written to and stored at the "B" replacement data lines. This subset represents a second portion of the codeword. No portion of the codeword, whether a subset of data bits and/or parity bits, is written to and stored at the "B" bad data lines. The remaining portions of the codeword, whether data bits and/or parity bits, are written to and stored at the "N−B" data lines (e.g., the data lines excluding the bad data lines).

Accordingly, in one particular example of an LDPC codeword, a data bit (or data symbol) of this codeword is stored in a replacement redundant line without being stored in a corresponding bad data line. A parity bit (or parity symbol) is stored in a free redundant line. Of course, other variations are possible, wherein any variation of a data bit (or data symbol) and parity bit (or parity symbol) or any combination of data bit and parity bit (e.g., in MLC, TLC, and QLC storage types) is stored in a cell that belongs to a data line (except a bad data line), a replacement redundant line, or a free redundant line.

At operation 606, the system accesses the information and reads the codeword from the block. This operation corresponds to a start of the decoding. For example, the information is accessed from the memory. The system determines the different total numbers of the data lines and redundant lines and at least the storage locations of the bad data lines from the information.

Given that the length of the codeword is variable (e.g., set to "N+R−B," where "B" depends on the number of defective cells), the system can derive the length from the determined numbers "N," "R," and "B." The data and parity bits of the codeword are read from the data lines (except the bad data lines), the replacement redundant lines, and the free redundant lines. Because no portions of the codeword are written to and stored at the bad data lines, reading the codeword avoids processing the bad data lines based on the identifiers (e.g., the storage locations) of the bad data lines. For example, the read skips the bad data lines based on their storage locations.

At operation 608, the system computes the total number "C" of columns of a parity check matric for decoding the codeword based on the information. For example, the proper size parity check matrix should be selected for LDPC decoding given the length "N+R−B" of the codeword (if the codeword is an LDPC codeword). Accordingly, the system uses the total numbers "N," "R," and "B" to compute "C." For instance, the system sets "C" "C≥N+R−B."

At operation 610, the system selects the parity check matrix from a plurality of parity check matrices available on the system based on the total number "C." Because the length of the codeword can vary, multiple parity check matrices are stored in memory of the system. Each parity check matrix is suitable to decode one particular length of codeword. Because the shortest codeword could have a length "N" (e.g., when "B" is equal to "R"), a base parity check matrix (the smallest matrix) has "N" columns. Conversely, because the longest codeword could have a length of "N−R" (e.g., when "B" is zero), the maximum parity check matrix has "N+R" columns. In between the base and maximum parity check matrices, there could be one or more intermediate parity check matrices, each having a total number of columns at some predefined increment "i," where "i" is an integer equal to or greater than one. The various parity check matrices may be stored in a nested structure, as further illustrated in the next figure, or as separate matrices on the system. The nested structure advantageously saves memory space.

In an example, the selection of the parity check matrix follows a rule stored in memory of the system. The rule specifies that a parity check matrix having the next total number of columns relative to "C" should be selected. For instance, the rule specifies that the base parity check matrix should be selected if "C" is equal to "N." Similarly, the rule specifies that the maximum parity check matrix should be selected if "C" is equal to "N+R." Otherwise, the rule specifies that one of the intermediate parity check matrices should be selected if that matrix has a total number of columns "N+i" that is next available increment relative to "C." In other words, a parity check matrix is selected if "N+i" is equal to "N+R−B" or is the next largest integer.

To illustrate, consider the following example. There are 1,000 data lines and twenty redundant lines. The predefined increment "i" of parity check matrices is ten. Accordingly, the base parity check matrix has 1,000 columns. There is one intermediate parity check matrix that has 1,010 columns. And the maximum parity check matrix has 1,020 columns. In a first illustration, the codeword has a length of 1,000 (e.g., there are twenty bad columns and, thus, there are twenty replacement redundant lines and no free redundant lines). In this case, the base parity check matrix is selected. In a second illustration, the codeword has a length of 1,020 (e.g., there are no bad columns and, thus, there are twenty free redundant lines). In this case, the maximum parity check matrix is selected. In a third illustration, the codeword has a length of 1,008 (e.g., there are twelve bad columns and, thus, there are eight free redundant lines). In this case, the intermediate parity check matrix is selected. In a fourth illustration, the codeword has a length of 1,012 (e.g., there are eight bad columns and, thus, there are twelve free redundant lines). In this case, the maximum parity check matrix is selected.

At operation 612, the system pads, as needed, the codeword based on the codewords' length and the total number "C." More specifically, because the rule specifies a parity check matrix selection having a next available increment, and because the predefined increment need not be one, there could be situations where the selected parity check matrix has a total number of columns that is greater than the length of the codeword. Referring back to the fourth illustration above, the codeword has a length of 1,012 whereas the selected parity check matrix has 1,020 columns. In these situations and for proper decoding, the system pads the codeword such that its length equals the total number of columns of the selected parity check matrix. Referring again to the fourth illustration, the codeword is padded by adding eight additional bits to it. Different padding techniques are possible. For instance, the system can use all "0" or an all "1" bits and can add these bits to the end of the codeword.

At operation 614, the system decodes the codeword based on the selected parity check matrix. In an example, hard or soft decoding can be implemented such that the codeword is iteratively decoding according to the variable nodes and check nodes associated with the selected parity check matrix.

Figure 7:
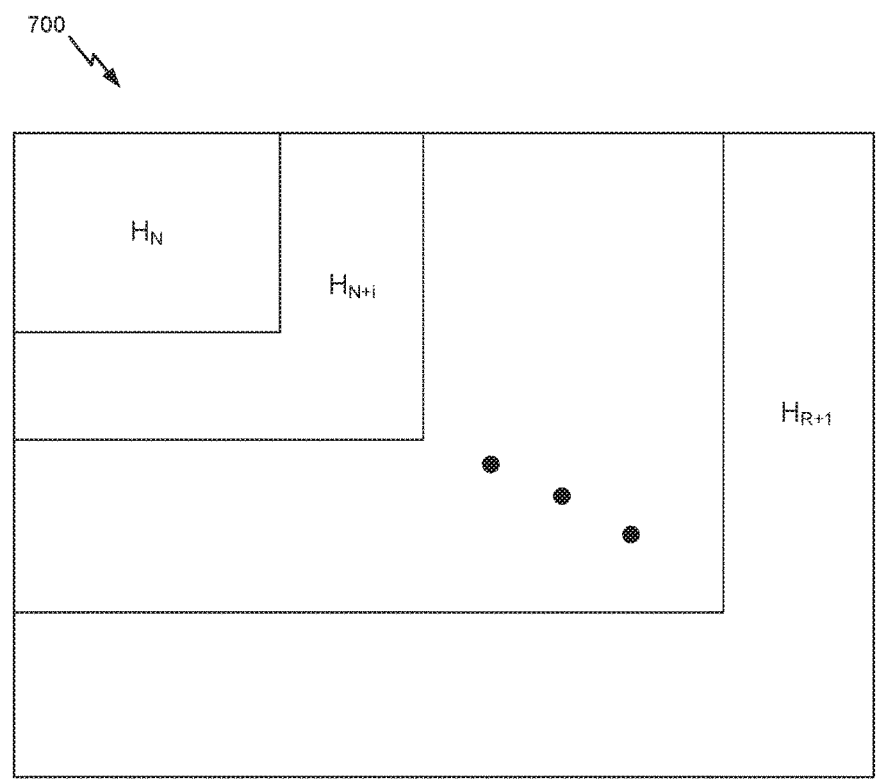
FIG. 7 illustrates example nested parity check matrices, in accordance with certain embodiments of the present disclosure.

FIG. 7 illustrates example nested parity check matrices 700, in accordance with certain embodiments of the present disclosure. These matrices 700 include base parity check matrix $H_N$, a maximum parity check matrix $H_{N+R}$, and intermediate parity check matrices (FIG. 7 shows $H_{N+1}$ as one of such intermediate parity check matrices). The base parity check matrix $H_N$ has a total number of columns that equals the shortest possible length of the codeword (e.g., this number is equal to "N"). The maximum parity check matrix $H_{N+R}$ has a total number of columns that equals the longest possible length of the codeword (e.g., this number is equal to "N+R"). There is a number of intermediate parity check matrices, each having dimensions (e.g., total number of columns) at some predefined increment "i." This predefined increment can be set based on a number of design factors. One example factor is the amount of storage space available to store the nested structure. The larger that space is, the smaller the predefined increment "i" can be made (resulting in a larger number of parity check matrices). Another example factor is the type of the flash storage. For example, with TLC, three bits of data are stored in each cell. Any cell from a free redundant line includes three bits. Thus, the predefined increment "i" can be set at a multiple of three. Yet another example factor is the total number "R" of redundant lines. For instance, the predefined increment "i" can be set as integer function of some percentage of the total number "R" (e.g., if "R" is equal to twenty, the predefined increment "i" can be set to four).

Generally, the nested structure represents a structure that stores nested matrices. A matrix at one level of the nesting includes the matrices at the previous levels and is included in the matrices at the next levels. For instance, consider the example where the predefined increment "i" is one. In this case, the intermediate parity check matrix $H_{N+1}$ includes the base parity check matrix $H_N$ and is included in the intermediate parity check matrix $H_{N+2}$ and all the subsequent intermediate parity check matrices up to the maximum parity check matrix $H_{N+R}$.

Figure 8:
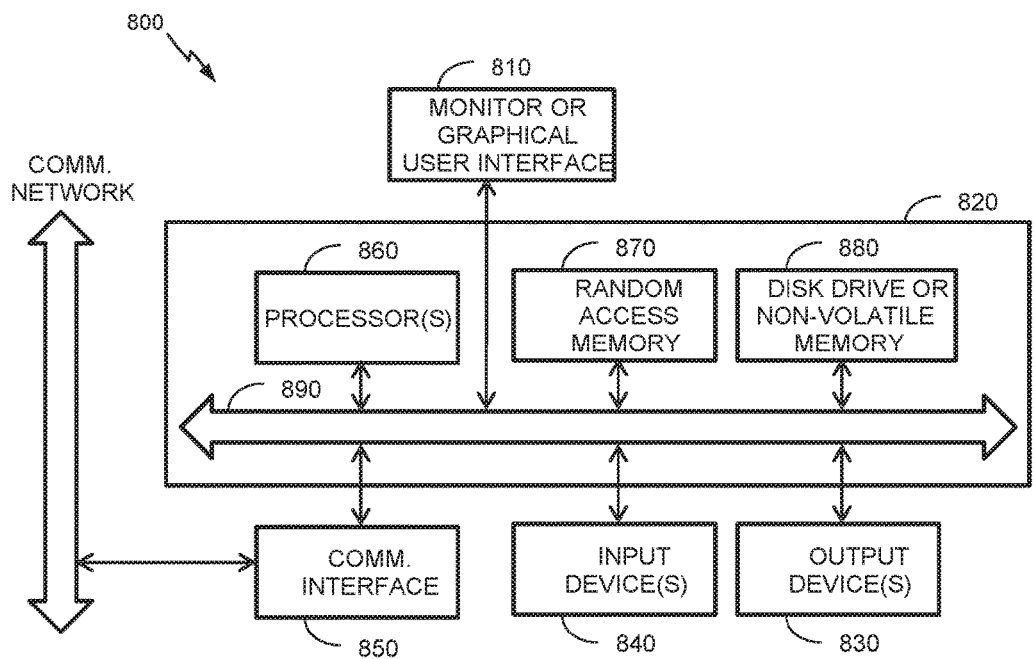
FIG. 8 describes one potential implementation of a system which may be used, according to one embodiment.

FIG. 8 describes one potential implementation of a system which may be used, according to one embodiment. FIG. 8 is merely illustrative of an embodiment of the present disclosure and does not limit the scope of the disclosure as recited in the claims. In one embodiment, the system is a computer system 800 that typically includes a monitor 810, a computer 820, user output devices 830, user input devices 840, communications interface 850, and the like. The system 100 of FIG. 1 implements some or all of the components of the computer system 800.

As shown in FIG. 8, the computer 820 may include a processor(s) 860 that communicates with a number of peripheral devices via a bus subsystem 890. These peripheral devices may include the user output devices 830, the user input devices 840, the communications interface 850, and a storage subsystem, such as random access memory (RAM) 870 and disk drive 880.

The user input devices 830 include all possible types of devices and mechanisms for inputting information to the computer system 820. These may include a keyboard, a keypad, a touch screen incorporated into the display, audio input devices such as voice recognition systems, microphones, and other types of input devices. In various embodiments, the user input devices 830 are typically embodied as a computer mouse, a trackball, a track pad, a joystick, wireless remote, drawing tablet, voice command system, eye tracking system, and the like. The user input devices 830 typically allow a user to select objects, icons, text and the like that appear on the monitor 810 via a command such as a click of a button or the like.

The user output devices 840 include all possible types of devices and mechanisms for outputting information from the computer 820. These may include a display (e.g., the monitor 810), non-visual displays such as audio output devices, etc.

The communications interface 850 provides an interface to other communication networks and devices. The communications interface 850 may serve as an interface for receiving data from and transmitting data to other systems. Embodiments of the communications interface 850 typically include an Ethernet card, a modem (telephone, satellite, cable, ISDN), (asynchronous) digital subscriber line (DSL) unit, FireWire interface, USB interface, and the like. For example, the communications interface 850 may be coupled to a computer network, to a FireWire bus, or the like. In other embodiments, the communications interfaces 850 may be physically integrated on the motherboard of the computer 820, and may be a software program, such as soft DSL, or the like.

In various embodiments, the computer system 800 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 820 includes one or more Xeon microprocessors from Intel as the processor(s) 860. Further, in one embodiment, the computer 820 includes a UNIX-based operating system.

The RAM 870 and the disk drive 880 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 870 and the disk drive 880 may be configured to store the basic programming and data constructs that provide the functionality of the present disclosure.

Software code modules and instructions that provide the functionality of the present disclosure may be stored in the RAM 870 and the disk drive 880. These software modules may be executed by the processor(s) 860. The RAM 870 and the disk drive 880 may also provide a repository for storing data used in accordance with the present disclosure.

The RAM 870 and the disk drive 880 may include a number of memories including a main random access memory (RAM) for storage of instructions and data during program execution and a read only memory (ROM) in which fixed non-transitory instructions are stored. The RAM 870 and the disk drive 880 may include a file storage subsystem providing persistent (non-volatile) storage for program and data files. The RAM 870 and the disk drive 880 may also include removable storage systems, such as removable flash memory.

The bus subsystem 890 provides a mechanism for letting the various components and subsystems of the computer 820 communicate with each other as intended. Although the bus subsystem 890 is shown schematically as a single bus, alternative embodiments of the bus subsystem may utilize multiple busses.

FIG. 8 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A computer-implemented method for codeword decoding on a system, the computer-implemented method comprising:
    accessing, by the system, information about a block of a storage device of the system, wherein the block comprises data lines and redundant lines, and wherein:
        the data lines are available to store data and comprise a bad data line that is unreliable for data storage,
        the redundant lines comprise: (i) a redundant line that replaces the bad data line, and (ii) a free redundant line that remains available after replacement of all bad data lines from the data lines, and
        the information comprises an identifier of the bad data line and an identifier of the free redundant line;
    accessing, by the system, a codeword stored in the block, wherein a portion of the codeword is stored in the free redundant line; and
    decoding, by the system, the codeword based on the identifier of the bad data line and the identifier of the free redundant line.

2. The computer-implemented method of claim 1, wherein the codeword comprises data bits and parity bits, wherein a subset of the parity bits is stored in the free redundant line.

3. The computer-implemented method of claim 2, wherein a subset of the data bits is stored in the bad data line, and wherein decoding the codeword comprises declaring the subset as being unreliable for the decoding based on the identifier of the bad data line.

4. The computer-implemented method of claim 2, wherein no portion of the codeword is stored in the bad data line, and wherein accessing the codeword avoids processing the bad data line based on the identifier of the bad data line.

5. The computer-implemented method of claim 1, wherein a total number of the data lines is "N," wherein a total number of the redundant lines is "R," and wherein the codeword has a length of "N+R".

6. The computer-implemented method of claim 5, wherein the codeword is a low density parity check (LDPC) codeword, and wherein the codeword is decoded with a parity check matrix that has "N+R" columns.

7. The computer-implemented method of claim 6, wherein a subset of data bits of the codeword is stored in the bad data line, wherein the identifier of the bad line comprises a storage location of the bad data line, and wherein decoding the codeword comprises setting a log-likelihood ratio (LLR) of the subset of the data bits to zero at the storage location.

8. The computer-implemented method of claim 1, wherein no portion of the codeword is stored in the bad data line, wherein a total number of the data lines is "N," wherein a total number of the redundant lines is "R," wherein a total number of the bad data lines is "B," and wherein the codeword has a length of "N+R−B".

9. The computer-implemented method of claim 8, wherein the codeword is a low density parity check (LDPC) codeword, wherein the LDPC codeword is decoded with a parity check matrix, wherein a total number of columns of the parity check matrix is "C," and wherein "C≥N+R−B".

10. The computer-implemented method of claim 9, wherein the information about the block of the storage device further comprises the total number of the data lines "N," the total number of the redundant lines "R," and the total number of the bad data lines is "B," wherein decoding the codeword comprises:
    computing, by the system, the total number of the columns of the parity check matrix "C" based on the total number of the data lines "N," the total number of the redundant lines "R," and the total number of the bad data lines "B" from the information about the block;
    selecting the parity check matrix from a plurality of parity check matrices available on the system; and
    decoding the codeword based on the parity check matrix.

11. The computer-implemented method of claim 10, wherein the codeword comprises data bits and parity bits, wherein the identifier of the bad line comprises a storage location of the bad data line, and wherein accessing the codeword accessing the data bits and the parity bits based on a read of the block, wherein the read skips the bad data line based on the storage location of the bad data line.

12. A system comprising:
    a storage device that comprises a block;
    one or more processors; and one or more memories communicatively coupled with the one or more processors and storing instructions that, upon execution by the one or more processors, configure the system to at least:

access information about a block of a storage device of the system, wherein the block comprises data lines and redundant lines, and wherein:

the data lines are available to store data and comprise a bad data line that is unreliable for data storage, the redundant lines comprise: (i) a redundant line that replaces the bad data line, and (ii) a free redundant line that remains available after replacement of all bad data lines from the data lines, and the information comprises an identifier of the bad data line and an identifier of the free redundant line;

access a codeword stored in the block, wherein a portion of the codeword is stored in the free redundant line; and decode the codeword based on the identifier of the bad data line and the identifier of the free redundant line.

13. The system of claim 12, wherein a first portion of the codeword is stored in the free redundant line, wherein a second portion of the codeword is stored in the bad data line, and wherein decoding the codeword comprises declaring the second portion as being unreliable for the decoding based on the identifier of the bad data line.

14. The system of claim 12, wherein a portion of the codeword is stored in the free redundant line, wherein no portion of the codeword is stored in the bad data line, wherein a total number of the data lines is "N," wherein a total number of the redundant lines is "R," wherein a total number of the bad data lines is "B," and wherein the codeword has a length of "N+R−B".

15. The system of claim 14, wherein the codeword is decoded with a parity check matrix, wherein a total number of columns of the parity check matrix is "C," wherein "C≥N+R−B," wherein decoding the codeword comprises:

computing, by the system, the total number of the columns of the parity check matrix "C" based on the total number of the data lines "N," the total number of the redundant lines "R," and the total number of the bad data lines "B" from the information about the block;

selecting the parity check matrix from a plurality of parity check matrices available on the system, wherein the plurality of parity check matrices are either nested parity check matrices or stored as separate matrices on the system; and decoding the codeword based on the parity check matrix.

16. The system of claim 15, wherein the plurality of parity check matrices comprises a base parity check matrix, a maximum parity check matrix, and an intermediate parity check matrix, wherein a total number of columns of the base parity check matrix is "N," wherein a total number of columns of the maximum parity check matrix is "N+R," and wherein a total number of columns of the intermediate parity check matrix is "N+i," wherein "i" is a predefined increment.

17. The system of claim 16, wherein selecting the parity check matrix from the plurality of parity check matrices comprises selecting the intermediate parity check matrix based on a determination that "N+i" is the next available increment relative to the total number of the columns of the parity check matrix "C," and wherein decoding the codeword comprises padding the codeword with at least "i−R+B" additional bits.

18. One or more non-transitory computer-readable storage media comprising instructions that, upon execution on a system, configure the system to perform operations comprising:

accessing information about a block of a storage device of the system, wherein the block comprises data lines and redundant lines, and wherein:

the data lines are available to store data and comprise a bad data line that is unreliable for data storage, the redundant lines comprise: (i) a redundant line that replaces the bad data line, and (ii) a free redundant line that remains available after replacement of all bad data lines from the data lines, and the information comprises an identifier of the bad data line and an identifier of the free redundant line;

accessing a codeword stored in the block, wherein a portion of the codeword is stored in the free redundant line; and decoding the codeword based on the identifier of the bad data line and the identifier of the free redundant line.

19. The one or more non-transitory computer-readable storage media of claim 18, wherein the codeword comprises data bits and parity bits, wherein a subset of the parity bits is stored in the free redundant line, wherein a subset of the data bits is stored in the bad data line, and wherein decoding the codeword comprises declaring the subset as being unreliable for the decoding based on the identifier of the bad data line.

20. The one or more non-transitory computer-readable storage media of claim 18, wherein the codeword comprises data bits and parity bits, wherein a subset of the parity bits is stored in the free redundant line, wherein no portion of the codeword is stored in the bad data line, and wherein accessing the codeword avoids processing the bad data line based on the identifier of the bad data line.

* * * * *